United States Patent
Chi

[11] Patent Number: 6,144,075
[45] Date of Patent: Nov. 7, 2000

[54] CMOS INVERTER USING GATE INDUCED DRAIN LEAKAGE CURRENT

[75] Inventor: Min-hwa Chi, Hsinchu, Taiwan

[73] Assignee: Taiwan Semiconductor Manufacturing Corp., Hsinchu, Taiwan

[21] Appl. No.: 09/177,787

[22] Filed: Oct. 22, 1998

[51] Int. Cl.⁷ ................................................. H01L 29/76
[52] U.S. Cl. ............................................ 257/368; 257/369
[58] Field of Search ..................................... 257/368, 369

[56] References Cited

U.S. PATENT DOCUMENTS

| | | | |
|---|---|---|---|
| 5,172,209 | 12/1992 | Chang | 257/368 |
| 6,025,625 | 2/2000 | Chi | 257/315 |
| 6,088,259 | 7/2000 | Chi | 257/300 |

OTHER PUBLICATIONS

IEEE Journal of Solid–State Circuits, vol. SC–11, No. 4, pp. 443–452 by Lin et al., Aug. 1976.

*Primary Examiner*—Mark V. Prenty
*Attorney, Agent, or Firm*—Blakely, Sokoloff, Taylor & Zafman, LLP

[57] ABSTRACT

An inverter formed in a semiconductor substrate is disclosed. The inverter comprises: a p-well formed in the substrate, the p-well being the output of the inverter; a gate structure formed atop the p-well, the gate structure being the input of the inverter and being formed from a thin gate oxide layer underneath a conductive layer; an n– base formed adjacent to a first edge of the gate structure; a p+ structure formed within the n– base; and a n+ structure adjacent a second edge of the gate structure.

14 Claims, 3 Drawing Sheets

CMOS INVERTER USING GATE INDUCED DRAIN LEAKAGE CURRENT

FIELD OF THE INVENTION

The present invention generally relates to CMOS inverters, and more particularly, to a small size inverter whose operation is based upon gate induced drain leakage (GIDL) current.

BACKGROUND OF THE INVENTION

The inverter is one of the most fundamental elements in digital integrated circuits. The inverter is a single input, single output digital device. If a "1" is input to the input of the inverter, the output of the inverter will be a "0". Conversely, if a "0" is input to the input of the inverter, the output of the inverter will be a "1". Multiple numbers of inverters can be combined to form logical operators such as AND, OR, NAND, NOR, and other logical function blocks. Thus, in present day VLSI technology, there can be millions of inverters in a single integrated circuit performing complex logical functions.

The most common design for a CMOS inverter is shown in FIGS. 1 and 2. The CMOS inverter is comprised of one n-MOS transistor 101 and one p-MOS transistor 103. Both the n-MOS transistor 101 and p-MOS transistor 103 are enhancement mode devices with a typical threshold voltage of 0.7 volts. The output drains of the n-MOS transistor 101 and the p-MOS transistor 103 are connected together. The gate of both the n-MOS transistor 101 and the p-MOS transistor 103 are connected together to the input signal. The output of the inverter is the connection of the drains of the n-MOS and p-MOS transistors. The source of the n-MOS transistor 101 is grounded and the source of the p-MOS transistor is biased at a voltage $V_{cc}$.

In operation, when the input voltage $V_i$ is "high", the n-MOS transistor 101 is on and the output $V_o$ is pulled down to ground or "low". When the input voltage $V_i$ is "low", the p-MOS transistor 103 turns on and the output $V_o$ is biased to $V_{cc}$, which is considered "high".

As can be seen from FIG. 2, the prior art CMOS inverter requires two separate wells, a p-well 105 for the n-MOS transistor 101 and an n-well 107 for the p-MOS transistor 103. In addition, two control gates are necessary and an output contact is required. This makes the inverter relatively large.

What is needed is a new inverter structure that is small in size while still easy to operate and manufacture in accordance with standard CMOS manufacturing techniques.

SUMMARY OF THE INVENTION

An inverter formed in a semiconductor substrate is disclosed. The inverter comprises: a p-well formed in said substrate, said p-well being the output of said inverter; a gate structure formed atop said p-well, said gate structure being the input of said inverter and being formed from a thin gate oxide layer underneath a conductive layer; an n− base formed adjacent to a first edge of said gate structure; a p+ structure formed within said n− base; and a n+ structure adjacent a second edge of said gate structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
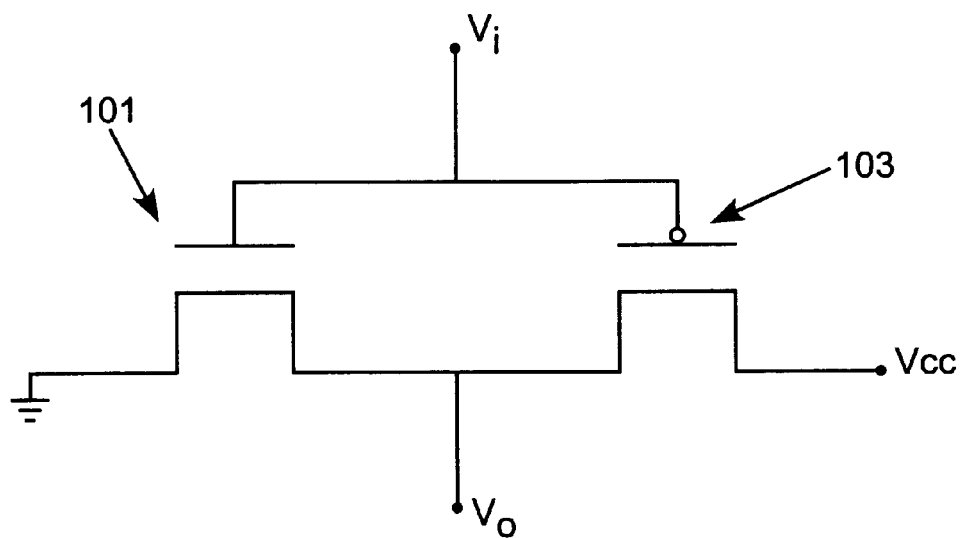
FIG. 1 is an electrical schematic of a prior art CMOS inverter.
Figure 2:
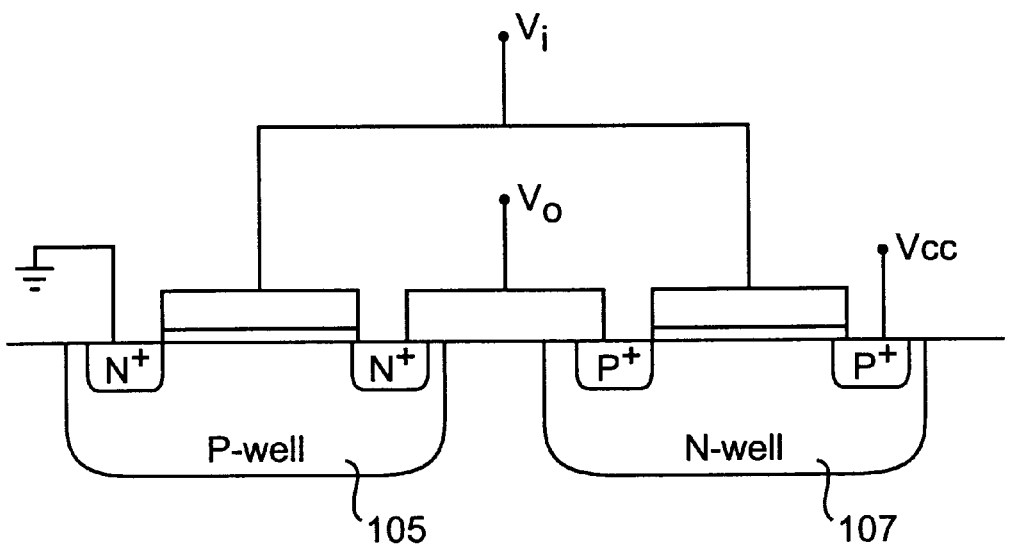
FIG. 2 is a cross-section view of a semiconductor substrate implementing the CMOS inverter of FIG. 1.
Figure 3:
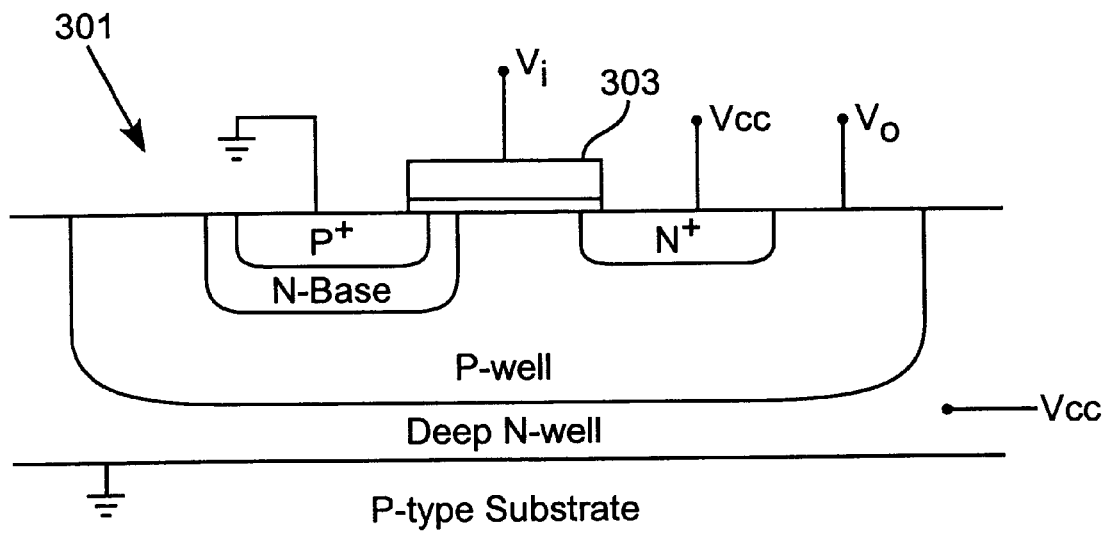
FIG. 3 is a cross-section view of a semiconductor substrate having formed therein a p-well CMOS inverter in accordance with the present invention.

Turning to FIG. 3, a p-type substrate is used as the foundation for the formation of a CMOS inverter 301 in accordance with the present invention. Formed in the p-type substrate is a deep n-well. Preferably, the deep n-well is formed by ion implantation using conventional methods. The deep n-well is preferably approximately 3 microns deep and has a dopant concentration of approximately $10^{15}/cm^3$.

Next, a p-well is formed in the deep n-well using conventional masking and ion implantation technology. The p-well is preferably approximately 1.5 microns deep and has a dopant concentration of $10^{16}/cm^3$.

Next, a gate oxide layer is formed over the substrate. The gate oxide is typically a thin silicon dioxide layer formed by thermal oxidation. Formed atop the gate oxide layer is an in situ doped polysilicon layer. The layer of polysilicon and the layer of gate oxide is then patterned and etched to form a gate structure 303.

After formation of the gate structure 303, an n− base is formed within the p-well. The n− base is self aligned to one edge of the gate structure 303. Preferably, the n− base is formed using conventional diffusion techniques or by a combination of ion implantation and thermal diffusion. As will be seen below, this allows a single mask to be used to form the n− base and the p+ structure. The thermal diffusion allows the n− base to expand laterally so that it extends underneath the gate structure 303. After diffusion, the n− base has a depth of 0.7 microns and has a dopant concentration of $10^{17}/cm^3$. Preferably, the dopant is phosphorous. Notice that the n− base physically separates the p+ region and the p− well.

Next, a p+ structure is formed within the n− base and is self-aligned to one edge of the gate structure 303. The same mask may be used to form the p+ structure as is used to form the n− base. The p+ structure preferably is formed using ion implantation to a depth of 0.3 microns and having a dopant concentration of $10^{20}/cm^3$. Preferably, the dopant used is boron.

Formed adjacent to the other edge of the gate structure 303 is an n+ structure. The n+ structure is formed in the p-well and is self-aligned to the gate structure 303. Preferably, the n+ structure has a depth of 0.3 microns and has a dopant concentration of $10^{20}/cm^3$.

Note that each of the manufacturing steps described above are commonly used in a CMOS process for forming prior art transistors. Therefore, the inverter of the present invention can be easily integrated into the process for forming standard CMOS transistors.

Finally, conventional methods are used to form contacts and interconnect to the various structures in the inverter 301.

For example, the p+ structure and the p-type substrate are connected to ground (or more generically $V_{ss}$). The gate structure 303 is connected to an input terminal $V_i$. The n+ structure and the deep n-well are connected to a biasing voltage $V_{cc}$. Finally, the p-well is electrically connected to the output terminal $V_o$.

In operation, when the input bias $V_i$ is high (or approximately $V_{cc}$), electrons are generated on the surface of the p+ structure by band-to-band tunneling. These band-to-band tunneling generated electrons will flow into the n– base region (which is at a higher potential than the p+ structure) and pull down the n– base potential as well as the p– well potential to near ground. Similarly, when the input bias $V_i$; is low (approximately ground), holes are generated on the surface of the n+ structure by band-to-band tunneling. These band-to-band tunneling generated holes will flow into the p-well region (which is at a lower potential than the n+ structure) and pull up the p-well potential to approximately $V_{cc}$. Thus, the p-well potential is set by the above mechanism and is the opposite polarity to the input $V_i$.

Several points should be made of the inverter 301 of FIG. 3. First, the n– base should have a dopant concentration that is high enough so that there is no MOS action in the parasitic n-MOS or p-MOS. The p-well is floating and it serves as the output of the inverter 301. Moreover, there is no lightly doped drain (LDD) structure, implant, or spacer. Therefore, the surface of the n+ structure and the p+ structure can generate holes and electrons, respectively, by band-to-band tunneling (BBT). This, in turn, will result in gate-induced drain leakage (GIDL) current and will operate to change the potential of the p-well.

The GIDL current typically occurs in thin gate oxide MOS devices and is current between the drain and the substrate. The basis of the GIDL current is band-to-band tunneling that occurs on the surface of the gate-to-drain overlap region. Additional information on GIDL current may be found in "Design for Suppression of Gate-Induced Drain Leakage in LDD MOSFET's Using a Quasi-2-Dimensional Analytical Model," by Parke et al., IEEE Transactions on Electron Devices, Vol. 39, No. 7, July 1992, pp. 694–1702. In that article, the authors explain that an n+ region underneath a gate edge produces a high vertical electrical field that results in hole generation on the surface of an n+ region underneath the gate by band-to-band tunneling in the device.

It should also be noted that the inverter 301 can be fabricated by a process that is fully compatible with standard CMOS processes. Specifically, all of the process steps described above to form the inverter 301 are commonly used in a CMOS process flow for the formation of transistors. Additionally, the inverter 301 is much smaller than a conventional CMOS inverter. Also important, there is no DC power consumption if the output is connected to the next stage by capacitive coupling. This is particularly useful for SRAMs, where there is no need of "local interconnect" technology.

Figure 4:
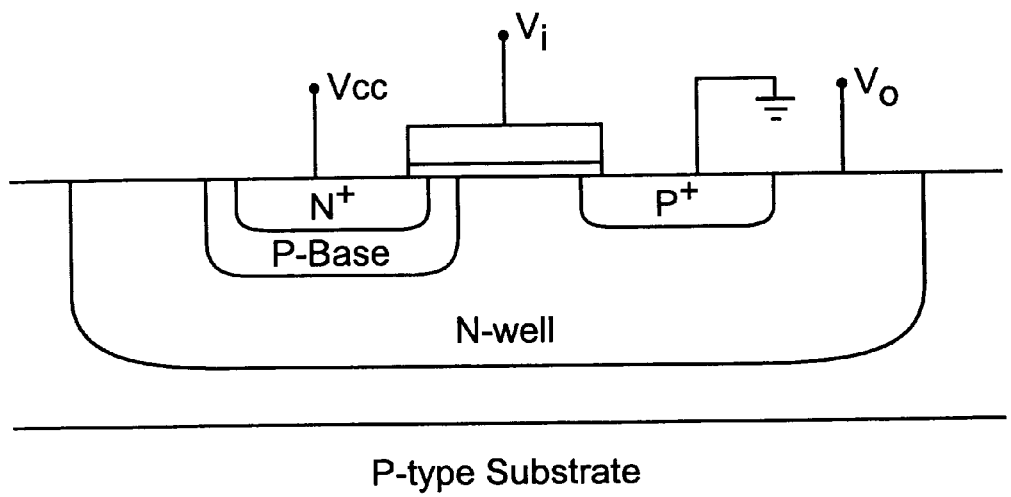
FIG. 4 is a cross-section view of a semiconductor substrate having formed therein an n-well CMOS inverter in accordance with the present invention.

By inverting the polarities of the conduction type and biases, a corresponding new inverter structure with an n-well as the output node may be manufactured. Such a device is shown in FIG. 4. Contacts and interconnects are formed to the various structures in the inverter 301. For example, the p+ structure and the p-type substrate are connected to ground (or more generically $V_{ss}$). The gate structure 303 is connected to an input terminal $V_i$. The n+ structure is connected to a biasing voltage $V_{cc}$. Finally, the n-well is electrically connected to the output terminal $V_o$.

For this embodiment, when the input bias $V_i$ is high (or approximately $V_{cc}$), electrons are generated on the surface of the p+ structure by band-to-band tunneling. These band-to-band tunneling generated electrons will flow into the n-well region (which has a higher potential than the p+ structure) and pull down its potential to approximately ground. Similarly, when the input bias is low (approximately ground), holes are generated on the surface of the n+ structure by band-to-band tunneling. These band-to-band tunneling generated holes will flow into the n-well region (which has a lower potential than the n+ structure) and pull up its potential to approximately $V_{cc}$. Thus, the n-well potential as set by the above mechanism and is the opposite to the input $V_i$.

Figure 5A:
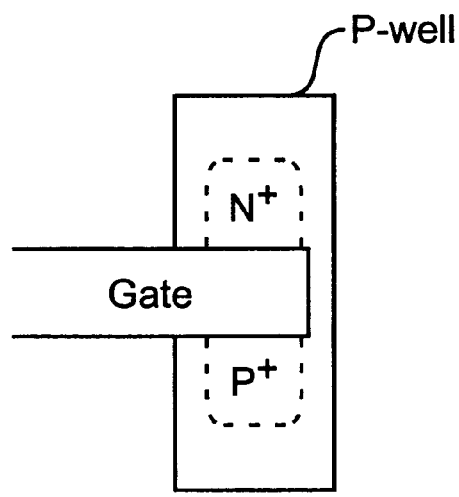
FIG. 5A is a top layout view of a p-well CMOS inverter in accordance with the present invention.
Figure 5B:
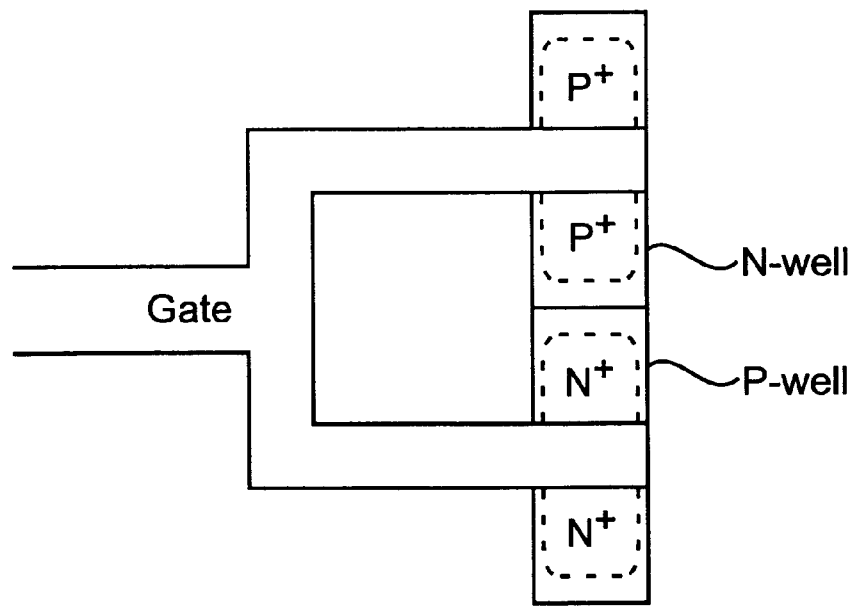
FIG. 5B is a top layout view of a prior art CMOS inverter.

A comparison of the layout implementation of a conventional prior art inverter and the inverter 301 of the present invention is shown in FIGS. 5A and 5B. As can be seen, the new inverter in accordance with the present invention is approximately 50 percent smaller than a conventional CMOS inverter.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An inverter formed in a semiconductor substrate comprising a p-well formed in said substrate, said p-well being the output of said inverter;

a gate structure formed atop said p-well, said gate structure being the input of said inverter and being formed from a thin gate oxide layer underneath a conductive layer;

an n– base formed adjacent to a first edge of said gate structure;

a p+ structure formed within said n– base; and a n+ structure adjacent a second edge of said gate structure.

2. The inverter of claim 1 wherein said n– base has a depth of 0.7 microns and a dopant concentration of about $10^{17}$/cm$^3$.

3. The inverter of claim 1 wherein said p+ structure has a depth of 0.3 microns and a dopant concentration of about $10^{20}$/cm$^3$.

4. The inverter of claim 1 wherein said n+ structure has a depth of 0.3 microns and a dopant concentration of about $10^{20}$/cm$^3$.

5. The inverter of claim 1 wherein said p+ structure is biased to a voltage $V_{ss}$ and said n+ structure is biased to a voltage $V_{cc}$.

6. The inverter of claim 5 wherein said p-well is formed within a deep n-well formed in a p-type substrate, said deep n-well biased to $V_{cc}$, and said p-type substrate is biased to $V_{ss}$.

7. The inverter of claim 1 wherein said p– well is the output of said inverter.

8. An inverter formed in a semiconductor substrate comprising an n-well formed in said substrate, said n-well being the output of said inverter;

a gate structure formed atop said n-well, said gate structure being the input of said inverter and being formed from a thin gate oxide layer underneath a conductive layer;

an p− base formed adjacent to a first edge of said gate structure;

a n+ structure formed within said p− base; and a p+ structure adjacent a second edge of said gate structure.

9. The inverter of claim 8 wherein said p− base has a depth of 0.7 microns and a dopant concentration of about $10^{17}/cm^3$.

10. The inverter of claim 8 wherein said n+ structure has a depth of 0.3 microns and a dopant concentration of about $10^{20}/cm^3$.

11. The inverter of claim 8 wherein said p+ structure has a depth of 0.3 microns and a dopant concentration of about $10^{20}/cm^3$.

12. The inverter of claim 8 wherein said n+ structure is biased to a voltage $V_{cc}$ and said p+ structure is biased to a voltage $V_{ss}$.

13. The inverter of claim 12 wherein said n-well is formed within a p-type substrate biased to $V_{ss}$.

14. The inverter of claim 8 wherein said n− well is the output of said inverter.

* * * * *